US006952139B2

(12) United States Patent
Endo et al.

(10) Patent No.: US 6,952,139 B2
(45) Date of Patent: Oct. 4, 2005

(54) OSCILLATOR AND ELECTRONIC APPARATUS USING THE SAME

(75) Inventors: Takashi Endo, Minowa-machi (JP); Yoichi Fujii, Minowa-machi (JP)

(73) Assignee: Seiko Epson Corporation (JP)

(*) Notice: Subject to any disclaimer, the term of this patent is extended or adjusted under 35 U.S.C. 154(b) by 14 days.

(21) Appl. No.: 10/805,500

(22) Filed: Mar. 19, 2004

(65) Prior Publication Data

US 2005/0116780 A1 Jun. 2, 2005

(30) Foreign Application Priority Data

Mar. 20, 2003 (JP) ....................................... 2003-078779
Mar. 2, 2004 (JP) ....................................... 2004-057587

(51) Int. Cl.[7] ................................................ H03K 3/06
(52) U.S. Cl. ....................................... 331/145; 331/149
(58) Field of Search ............................. 331/2, 44, 145, 331/149; 327/143–145, 376, 377; 377/19, 26

(56) References Cited

U.S. PATENT DOCUMENTS 4,531,826 A * 7/1985 Stoughton et al. ............ 399/80
5,596,512 A * 1/1997 Wong et al. .................. 702/63
5,850,156 A * 12/1998 Wittman ..................... 327/143
5,872,738 A * 2/1999 Yamashiroya ............... 365/200
5,923,099 A * 7/1999 Bilir ............................ 307/64
5,943,257 A * 8/1999 Jeon et al. .................. 365/145
6,412,075 B1 * 6/2002 Klein .......................... 713/322
6,552,578 B1 * 4/2003 Cheung et al. ............... 327/26
6,593,790 B2 * 7/2003 Kim ........................... 327/198
6,658,576 B1 * 12/2003 Lee ............................ 713/320
6,707,699 B1 * 3/2004 Jacob et al. ................ 365/145

FOREIGN PATENT DOCUMENTS

JP 5-79649 10/1993
JP 6-25960 4/1994

* cited by examiner

*Primary Examiner*—Timothy P. Callahan
*Assistant Examiner*—Hai L. Nguyen
(74) *Attorney, Agent, or Firm*—Harness, Dickey & Pierce, P.L.C.

(57) ABSTRACT

An oscillator operated with an external power source or an external save power source is provided comprising: a clock signal generation unit for generating and outputting a clock signal; a power-on detection unit for detecting the power-on of the external power source; a power-off detection unit for detecting the power-off of the external power source; a running time count unit for counting the running time from a time of the power-on detection signal being input to a time of the power-off detection signal being input; storage means for storing accumulated running time up to a power-on time of the external power source; and a control unit for reading the running time at the time of the power-off detection signal being input, reading the accumulated running time from the storage means, adding the running time to the accumulated running time, and storing the addition result as a new accumulated running time in the storage means.

17 Claims, 9 Drawing Sheets

OSCILLATOR AND ELECTRONIC APPARATUS USING THE SAME

RELATED APPLICATIONS

This application claims priority to Japanese Patent Application Nos. 2003-078779 filed Mar. 20, 2003 and 2004-057587 filed Mar. 2, 2004 which are hereby expressly incorporated by reference herein their entireties.

BACKGROUND

1. Technical Field of the Invention

The present invention relates to an oscillator capable of accumulating and storing the running time of an electronic apparatus and to an electronic apparatus using the oscillator.

2. Description of the Related Art

Recently, various electronic apparatuses such as a personal computer, copier, etc., have widely utilized electronic parts or mechanical parts such as an oscillator, a display including a liquid crystal display (LCD), a memory, a central processing unit (CPU), etc. In general, these electronic apparatuses have their own expiration dates. When the expiration dates are passed, the electronic apparatuses are discarded without exception. However, there are problems that it is difficult to acquire landfill space and the discarded apparatuses may influence the earth's environment. For this reason, it is necessary to determine whether or not the used parts are to be recycled and to sort the used parts in accordance with characteristics of the electronic apparatuses or the used parts. Therefore, relatively inexpensive parts are discarded and expensive products such as CPUs are recycled.

In addition, since even electronic apparatuses of the same type have different running times depending on their usage frequencies, the daily actual running time of the electronic apparatuses becomes one item to be managed. In some cases, an electronic apparatus is powered on/off in accordance with the working time in one day. In other cases, the electronic apparatus may be constantly driven without being powered off. Therefore, the running times of these cases are different depending on their usage. In particular, in the electronic apparatus powered on/off in accordance with the working time in one day, it is necessary to accurately count the running time and determine whether or not it is to be recycled based on its accumulated running time.

In an electronic apparatus whose accumulated running time must be managed, a construction shown in FIG. 10 is generally employed in order to count the running time. In FIG. 10, the electronic apparatus comprises a CPU 45, oscillators 1, 2, a timer circuit 44, memory devices such as a RAM 47, and a ROM 48, a backup power source (not shown), etc. The running time is accumulated in the timer circuit 44 based on a reference clock signal having a frequency of 32 kHz output from the oscillator 2, and the result is to be written in the RAM 47 through the CPU bus 49. For example, it is considered that the running time of a liquid crystal display used as a display 42 of a personal computer is accumulated and accurately managed.

In addition, as a representative personal apparatus, there is a cellular phone or a portable notebook personal computer. In these apparatuses, during their unused periods, their requisite functions such as a counting operation is always performed by means of a backup power source. In addition, while its user is moving, the portable electronic apparatus can be used but its battery needs to be periodically charged. Since it is not easy for a user to accurately check the usage times or running time, there is a need for the user to accurately check the actual status of the running time of these apparatuses.

As a conventional example, an arrangement where counter means with a backup battery is provided to count the running time of peripheral devices is disclosed in Japanese Unexamined Utility Model Application Publication No. 5-79649 (see Section 0011 and FIG. 1). As another conventional example, an arrangement where a current detector and a time measurement device are accommodated in one case is disclosed in Japanese Unexamined Utility Model Application Publication No. 6-25960 (see Section 0008 and FIG. 2).

A conventional oscillator or an electronic apparatus using the oscillator having the aforementioned construction has the following problems.

Since the conventional oscillator does not have a function of counting and retaining the running time of the electronic apparatus at a power-off time, individual function blocks for retaining and recording the running time shown in FIG. 10 need to be provided in the individual apparatus to store the running time count data in a memory. However, even though all the needed running time count data is stored in a memory, there is a problem in that the currently counted running time count data is lost at a power-off time and cannot be stored.

In addition, in order to prevent the loss of data, it is necessary to prepare a dedicated circuit for retaining data in combination with an external storage device such as a hard disk drive and an external backup power source, etc. In addition, since the individual function is not integrated but separately provided in each apparatus, there is a problem in that the size tends to be large in mounting and the cost tends to increase.

In addition, in a cellular phone or a portable notebook personal computer, since there is no function of counting the running time, accumulating running status, and displaying running status, there is a problem in that it is impossible for a user to check the running status of the apparatus.

In order to solve these problems, the present invention provides an oscillator capable of counting the running time, storing the count result, and preventing running time count data from being erased at a power-off time. In addition, the present invention also provides a compact low cost oscillator for counting the running time, storing the count result, and preventing running time count data from being erased at a power-off time.

In addition, the present invention also provides an electronic apparatus in which the running time of its peripheral devices or its used parts can be simply retained and managed and which can be conveniently used by using an oscillator for counting the running time, storing the count result, and preventing running time count data from being erased at a power-off time.

SUMMARY

According to an aspect of the present invention, there is provided an oscillator operated with an external power source or an external save power source, the save power source used at a power-off time of the external power source, the oscillator comprising: a clock signal generation unit for generating and outputting clock signals having predetermined frequencies; a power-on detection unit for detecting the power-on of the external power source and outputting power-on detection signals; a power-off detection unit for detecting the power-off of the external power source and outputting power-off detection signals; storage means for storing accumulated running time up to a power-on time of the external power source; a running time count unit for inputting the clock signals from the clock signal generation unit and counting the running time from a time of the power-on detection signals being input to a time of the power-off detection signals being input; and a control unit for reading the running time at the time of the power-off detection signals being input, reading the accumulated running time from the storage means, adding the running time to the accumulated running time, and storing the addition result as a new accumulated running time in the storage means.

According to the aforementioned construction, since an operation of the oscillator is compensated by power source voltage supplied by an external save power source at the power-off time of an external power source, there is an effect that the accumulated running time of an electronic apparatus or electronic parts is not erased. In addition, since the save power source is a temporary power source, there is an effect that it is possible to effectively facilitate low power consumption. In addition, in a case where the time period for counting the running time is within the working time in one day, it is not necessary to perform the count operation up to a day, a month, or a year. Therefore, the divider circuit of the running time count unit can be implemented with a simple construction such that the circuit can be obtained in an advantageous size.

According to another aspect of the present invention, there is provided an oscillator operated with an external power source or an external save power source, the save power source used at a power-off time of the external power source, the oscillator comprising: a clock signal generation unit for generating and outputting clock signals having predetermined frequencies; a power-on detection unit for detecting the power-on of the external power source and outputting power-on detection signals; a power-off detection unit for detecting the power-off of the external power source and outputting power-off detection signals; storage means for storing accumulated running time up to a power-on time of the external power source; a running time count unit for setting the accumulated running time, inputting the clock signals from the clock signal generation unit, and further accumulating the running time from a time of the power-on detection signals being input to a time of the power-off detection signals being input; and a control unit for reading the accumulated running time from the storage means at the time of the power-on detection signals being input to set the running time count unit with the read accumulated running time, reading a new accumulated running time counted by the running time count unit at the time of the power-off detection signals being input, and storing the new accumulated running time in the storage means.

According to the aforementioned construction, since an operation of the oscillator is compensated by power source voltage supplied by an external save power source at the power-off time of an external power source, there is an effect that the accumulated running time of an electronic apparatus or electronic parts is not erased. In addition, since the save power source is a temporary power source, there is an effect that it is possible to effectively facilitate low power consumption. In addition, since in the save process of reading the counted running time and storing it in the storing means, the process can be performed speedily since an addition operation is not required, there is an effect that the save power source is usefully reduced.

In the oscillator according to the present invention, it is preferable that the clock signal generation unit comprise a first oscillation circuit having a piezoelectric resonator, oscillating at a predetermined frequency to generate clock signals; and/or a second oscillation circuit having a resistor and a capacitor, oscillating at a predetermined frequency to generate clock signals.

According to the aforementioned construction, the oscillator using the first oscillation circuit can be used for a case where high accuracy of the running time is required, whereas the oscillator using the second oscillation circuit can be used for a case where high accuracy of the running time is not required. In other words, there is an effect that one of the oscillators can be selectively used in accordance with the user's usage (selection).

In the oscillator according to the present invention, it is preferable that the clock signal generation unit comprise an oscillation circuit selection unit for inputting the clock signals from the first and second oscillation circuits, selecting one of the clock signals based on external selection signals, and outputting the selected clock signal.

According to the aforementioned construction, there is an effect that the oscillators can be selectively used in accordance with the user's usage by classifying the case that accuracy is required and the other case that accuracy is not required. In addition, since a resistor and a capacitor can be built in an IC, there is an effect that a compact low cost oscillator can be obtained.

In the oscillator according to the present invention, it is preferable that the oscillator further comprise disable data storage means for storing disable data used to invalidate an operation by which the accumulated running time stored in the storage means is written and changed in accordance with externally input write signals, and the control unit perform a write operation based on the disable data.

According to the aforementioned construction, after the oscillator is built in the electronic apparatus, the rewrite operation on the accumulated running time is invalidated, so that it is possible to obtain a highly reliable accumulated running time.

In the oscillator according to the present invention, the oscillator comprises an event number count unit to which the power-on detection signals or the power-off detection signals are input and which counts the number of power-ons or the number of power-offs, and the control unit stores the accumulated number of power-ons or the accumulated number of power-offs in the storage means.

According to the aforementioned construction, since the power-on/off number can be counted, there is an effect that the usage frequency can be checked in addition to the running time of the electronic apparatus.

In the oscillator according to the present invention, it is preferable that the piezoelectric resonator be a tuning-fork-type quartz crystal resonator.

In the oscillator according to the present invention, it is preferable that the oscillator further comprise disable data storage means for storing disable data used to invalidate an operation by which the accumulated running time and/or the accumulated event number stored in the storage means is written and changed in accordance with externally input write signals, and the control unit perform a write operation based on the disable data.

According to the aforementioned construction, after the oscillator is built in the electronic apparatus, the rewrite operation on the accumulated running time and event number (the number of power-ons or the number of power-offs) is invalidated, so that it is possible to obtain a highly reliable accumulated running time and/or event number (the number of power-ons or the number of power-offs). According to the aforementioned construction, since a compact quartz crystal resonator can be obtained by using the tuning-fork-type quartz crystal resonator, there is an effect that a compact low cost oscillator can be obtained.

According to still another aspect of the present invention, there is provided an electronic apparatus that the aforementioned oscillator is built in and operates based on output signals of the aforementioned oscillators.

According to the aforementioned construction, the accumulated running time for each apparatus is semi-permanently stored in the oscillator even though users or methods used in accordance with a schedule of a user in one day are different for the same type electronic apparatuses. As a result, in a case where an expiration date of an electronic apparatus (for example, a personal computer) is expired, there is an effect that it is possible to easily determine whether or not it is to be recycled based on the accumulated running time read from the oscillator as a criterion for determination.

In the electronic apparatus according to the present invention, it is preferable that the electronic apparatus have at least an operational mode for temporarily stopping and driving the oscillator in accordance with a predetermined condition.

According to the aforementioned construction, in an electronic apparatus having a low power consumption mode such as a power down mode, an oscillator capable of retaining the currently accumulated running time by means of a temporary save power source at a power-off time of a main power source is used. As a result, since a backup power source for saving the accumulated running time is not needed, there is an effect that a low power consumption electronic apparatus can be obtained.

DETAILED DESCRIPTION

Hereinbelow, embodiments of the present invention will be described with reference to the drawings.

(1) First Embodiment

(1-1) Construction of First Embodiment

Construction of Oscillator 1

Figure 1:
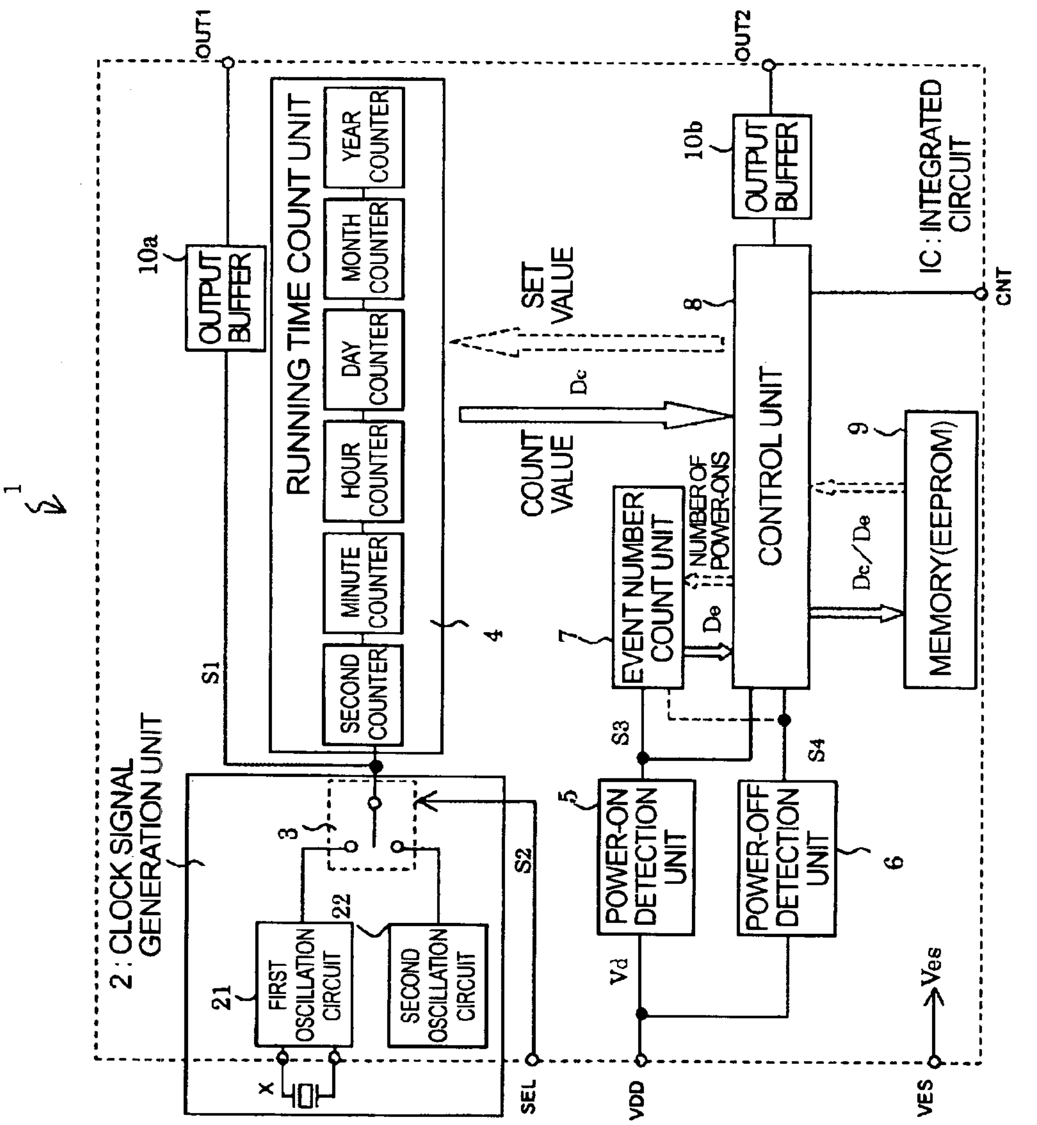
FIG. 1 is a block diagram illustrating a construction of an oscillator according to a first embodiment.

FIG. 1 is a block diagram illustrating a construction of an oscillator according to a first embodiment of the present invention. In FIG. 1, the oscillator 1 comprises a clock signal generation unit 2 having a first oscillation circuit 21, a second oscillation circuit 22, and an oscillation circuit selection unit 3 for selecting one of the clock signals from the two oscillation circuits 21 and 22; a running time count unit 4 for counting the running time using the selected clock signal; a power-on detection unit 5 for detecting a power-on of an external power source; a power-off detection unit 6 for detecting a power-off of the external power source; an event number count unit 7 for counting the number of power-on detections; a control unit 8 for controlling input/output of the running time and number of power-ons of the running time count unit 4 and the event number count unit 7; a memory (storage means) 9 for storing the counted running time and number of power-ons; and an output buffer 10*b* for outputting count data counted from the running time count unit 4. In addition, instead of the number of power-ons, the number of power-offs may be counted by the event number count unit 7 and stored in the memory 9.

The first oscillation circuit 21, which is a circuit oscillating at a predetermined frequency, comprises a piezoelectric resonator such as a tuning-fork-type quartz crystal resonator and an AT-cut-type quartz crystal resonator. In the embodiment, a tuning-fork-type quartz crystal resonator oscillating at a frequency of 32.768 kHz is described as an example. The tuning-fork-type quartz crystal resonator has an advantage in that it can be manufactured with a compact structure at the frequency of 32.768 kHz.

Figure 2:
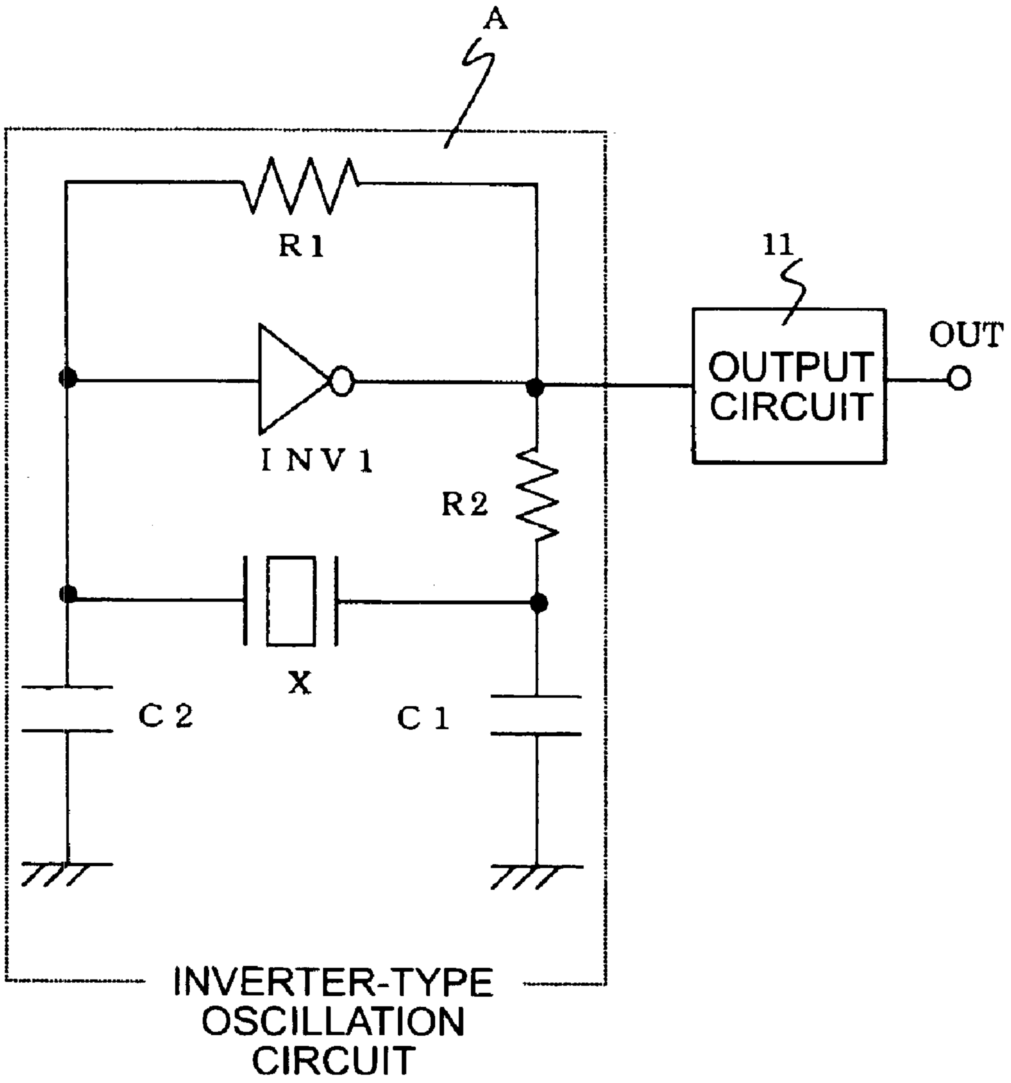
FIG. 2 is a circuit diagram illustrating a construction of an inverter-type oscillation circuit used for the first embodiment.

In addition, an inverter-type oscillation circuit may be used as an example of the first oscillation circuit 21. FIG. 2 is a diagram illustrating the construction of the inverter-type oscillation circuit A, of which an output port is connected to an output circuit 11, as an embodiment of the first oscillation circuit 21. The inverter-type oscillation circuit A comprises a quartz crystal resonator X, a feedback amplifier circuit (inverter INV1, feedback resistor R1) for operating the quartz crystal resonator X, and capacitors C1 and C2 connected to input/output ports of the feedback amplifier circuit. The capacitors C1 and C2, which are the load capacitance for performing a frequency variation fitting operation, etc., in an operating state of the quartz crystal resonator X, are capacitance elements having a fixed capacitance determined by design. The output circuit 11 inputs an oscillation signal from the inverter-type oscillation circuit A, and performs a wave shaping operation, and outputs a wave-shaped clock signal.

Figure 3:
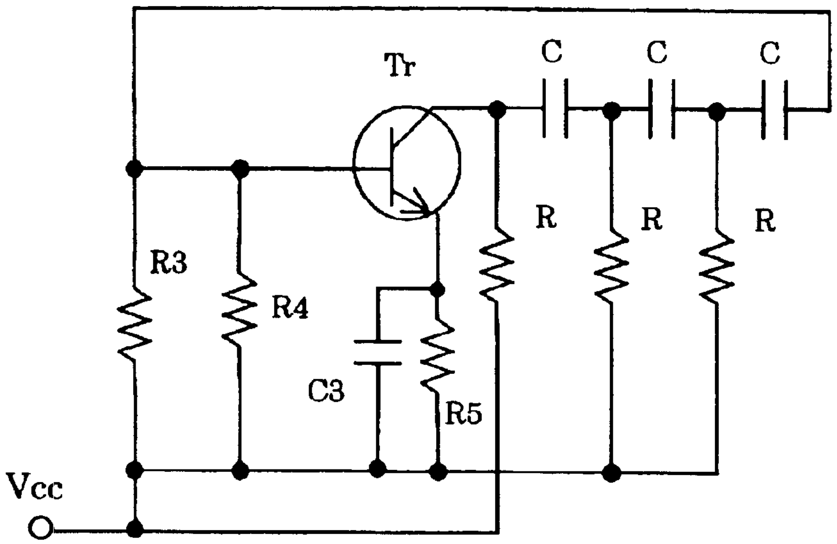
FIG. 3 is a circuit diagram illustrating an example of an RC oscillation circuit used for the first embodiment.

The second oscillation circuit 22 is an RC oscillation circuit oscillating at a low frequency by using a resistor R and a capacitor C. The oscillation circuit has the same oscillation frequency of 32.768 kHz as the first oscillation circuit 21, and it is used for a case where high accuracy is not required. For example, it is useful in a case where time management is performed in units of 12 or 24 hours. FIG. 3 is a circuit diagram of an example of the RC oscillation circuit. The RC oscillation circuit having a three-stage connection of resistors R and capacitors C can perform a 180° phase rotation at an arbitrary frequency and performs oscillation by performing in-phase feedback in accordance with a phase inversion of the amplifier unit. The second oscillation circuit 22 can be constructed with an IC having built-in resistors R and capacitors C, so that the oscillator 1 can be implemented in a small size and with low cost.

The oscillation circuit selection unit 3 selects one of the first and second oscillation circuits 21 and 22 based on an external selection signal S2. In addition, the clock signal generation unit 2 may be constructed with one of the first and second oscillation circuits 21 and 22. The first oscillation circuit is used for a case where high accuracy of running time is required, whereas the second oscillation circuit 22 is used for a case where high accuracy of the running time is not required, whereby they can be selectively used.

An output signal S1 from the oscillation circuit selection unit 3 is output as it is to an output port OUT1 through the output buffer 10*a*, and it can be used as various clock signals including a reference clock signal of a timer circuit (not shown), for example. The output buffer 10*a* is a buffer for driving a load circuit (not shown) connected to the output port OUT1.

The running time count unit 4 is a divider circuit for inputting one of the clock signals of the first and second oscillation circuits 21 and 22 and counting the running time from a power-on time to a power-off time of an electronic apparatus. The later-described control unit 8 sets the currently accumulated running time to the running time count unit 4 as an initial value, and the running time count unit 4 can perform a count operation from the set accumulated running time. Otherwise, with the control unit 8 not setting the initial value, the running time count unit 4 may perform the count operation from a time of 0.

The power-on detection unit 5 detects the power-on of a power source voltage Vd and outputs a power-on detection signal S3 to the event number count unit 7 or the control unit 8. The power-on detection signal S3 is a trigger signal for allocating a timing of setting the last count results to the running time count unit 4 and the event number count unit 7 and resuming counting.

The power-off detection unit 6 detects the power-off of the power source voltage Vd and outputs a power-off detection signal S4 to the control unit 8. The power-off detection signal S4 is a trigger signal for allocating a timing of storing each of the final count results of the running time count unit 4 and the event number count unit 7 in the memory 9.

The event number count unit 7 is a divider circuit for inputting the power-on detection signal S3 from the power-on detection unit 5 and counting the number of power-ons. The control unit 8 sets a currently accumulated count result as an initial value, and the event number count unit 7 can perform a count operation from the set initial value. Otherwise, with the control unit 8 not setting the initial value, the event number count unit 7 may perform the count operation from a time of 0.

The control unit 8 is a block for controlling input/output of the running time and the number of power-ons in the memory 9. When the power-on detection signal S3 is input, running time count data Dc is counted by the running time count unit 4, number-of-power-ons count data De is counted by the event number count unit 7. At a power-off time, power voltage is supplied by a later-described save power source, and the running time count data Dc and the number-of-power-ons count data De are acquired from the running time count unit 4 and the event number count unit 7, respectively, and stored (saved) in the memory 9.

There are two methods of counting the needed accumulated running time. One is a method of starting the count operation by setting the currently accumulated running time stored in the memory 9 to the running time count unit 4, reading a count result at a power-off time, and storing the count result in the memory 9. The other is a method of starting the count operation at the time of 0, reading a counted running time up to a power-off time, adding the read result to the last accumulated running time stored in the memory 9, and storing the addition result as a new accumulated running time in the memory 9. In a latter case where the running time count unit 4 performs the count operation from the time of 0, the control unit 8 has a function of adding the counted running time and the accumulated running time.

The number of power-ons can be counted by using the same methods as the above methods.

In addition, the accumulated running time count data Dc and the accumulated number-of-power-ons count data De stored in the memory 9 are erased based on an external control signal.

The memory 9 is a memory for storing the accumulated running time count data Dc, the accumulated number-of-power-ons count data De, and other types of data associated with control. A writable or rewritable memory such as a PROM (Programmable Read Only Memory) and an EPROM (Erasable PROM) is used for the memory. The preferable one is an electrically erasable EEPROM (Electrical Erasable PROM) that cannot be erased at a power-off time. The type of the EEPROM may be a flash EEPROM capable of performing a rewrite operation in units of 1 byte, and rewriting all bits at one time.

The output buffer 10*b* is a buffer for driving a load circuit (not shown) connected to an output port OUT2.

Save Power Source

Figure 4:
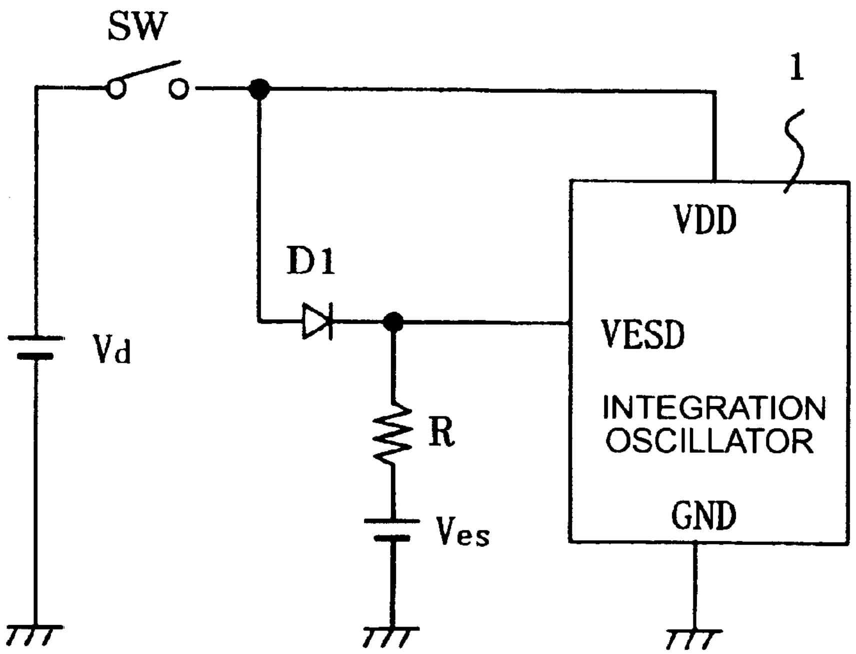
FIG. 4 is a circuit diagram illustrating an example of an oscillator according to the first embodiment of the present invention to which an external power source and a save power source are connected.

FIG. 4 is a circuit diagram illustrating an example of an oscillator 1 of the present invention to which an external power source and a save power source are connected.

In FIG. 4, when an external power source Vd is powered-off by a switch SW, a save power source Ves is supplied through a save power supply port VESD of the oscillator 1. Next, measurement data of the first oscillation circuit 21, the second oscillation circuit 22, the running time count unit 4, and the event number count unit 7 in the oscillator 1 supplied with the save power source voltage Ves are saved in the memory 9, so that the erasing of the currently counted running time count data Dc or the currently counted number-of-power-ons count data De can be prevented. The save power source is a power source temporarily supplied in order to save the running time count data Dc or the number-of-power-ons count data De to the memory 9 unlike a backup power source. Therefore, since a power source is not continuously supplied during a power-off state of the external power source Vd, it is possible to effectively facilitate low power consumption.

Examples of the save power source Ves include a super capacitor or a secondary battery. In addition, means of charging a capacitor (not shown) with an external power source in advance and performing backup temporarily by using the charged capacitor at a power-off time of the power source voltage of the external power source may be employed.

External Test Device

Next, an external test device 30 will be described with reference to FIG. 5.

Figure 5:
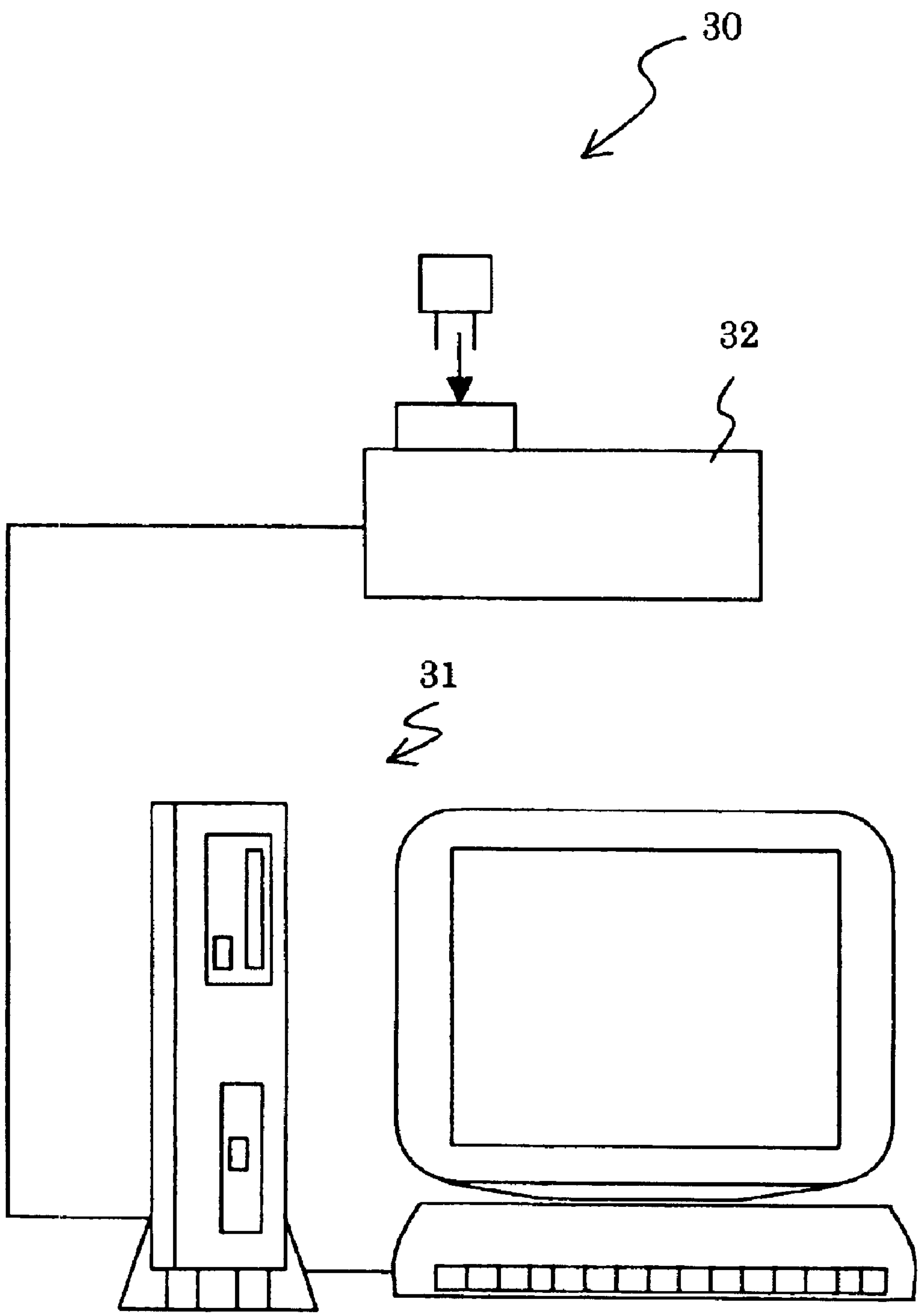
FIG. 5 is a drawing illustrating a schematic construction of a write device used to test the oscillator of the first embodiment.

FIG. 5 is a diagram illustrating a schematic construction of the external test device 30. The external test device 30 comprises a personal computer (hereinafter, referred to as a PC) 31 in which a predetermined application program is installed, and a connection unit 32 for electrical connection with the oscillator 1. Under the control of the PC 31, the connection unit 32 drives the oscillator 1 and commands the control unit 8 in the oscillator 1 to read or write the accumulated running time count data Dc and the number-of-power-ons count data De stored in the memory 9. An operator of the PC 31 performs an operation necessary for testing with the PC 31, inputs a control signal according to a control command for the oscillator 1 to a control port CNT, and performs a necessary test on the oscillator 1. For example, the test for temporarily operating the running time count unit 4 or the event number count unit 7 and determining whether or not the count results are correctly written in the memory 9 is conducted. In addition, a test for setting an accumulated running time count data (externally written in the memory 9) to the running time count unit 4 and reading and checking the accumulated running time (written in the memory 9 at a power-off time of the external power source after a certain time period is passed) may be performed.

The control command is provided with commands according to a test level or an actual operation. The control command is used for a case where an oscillator manufacturer performs an individual test on the oscillator or a case where a user tests a board of an electronic apparatus with a built-in oscillator. For example, the test for outputting the counted time from the running time count unit 4 of the oscillator 1 to the output port OUT2, and determining whether or not the operation of the running time count unit 4 is correct is conducted. In this case, the test is performed by inputting the control signal (corresponding to a command associated with the test) to the control port CNT.

(1-2) Operation of First Embodiment

Next, the operation of the first embodiment will be described with reference to FIGS. 6 and 7.

Embodiment 1

Figure 6:
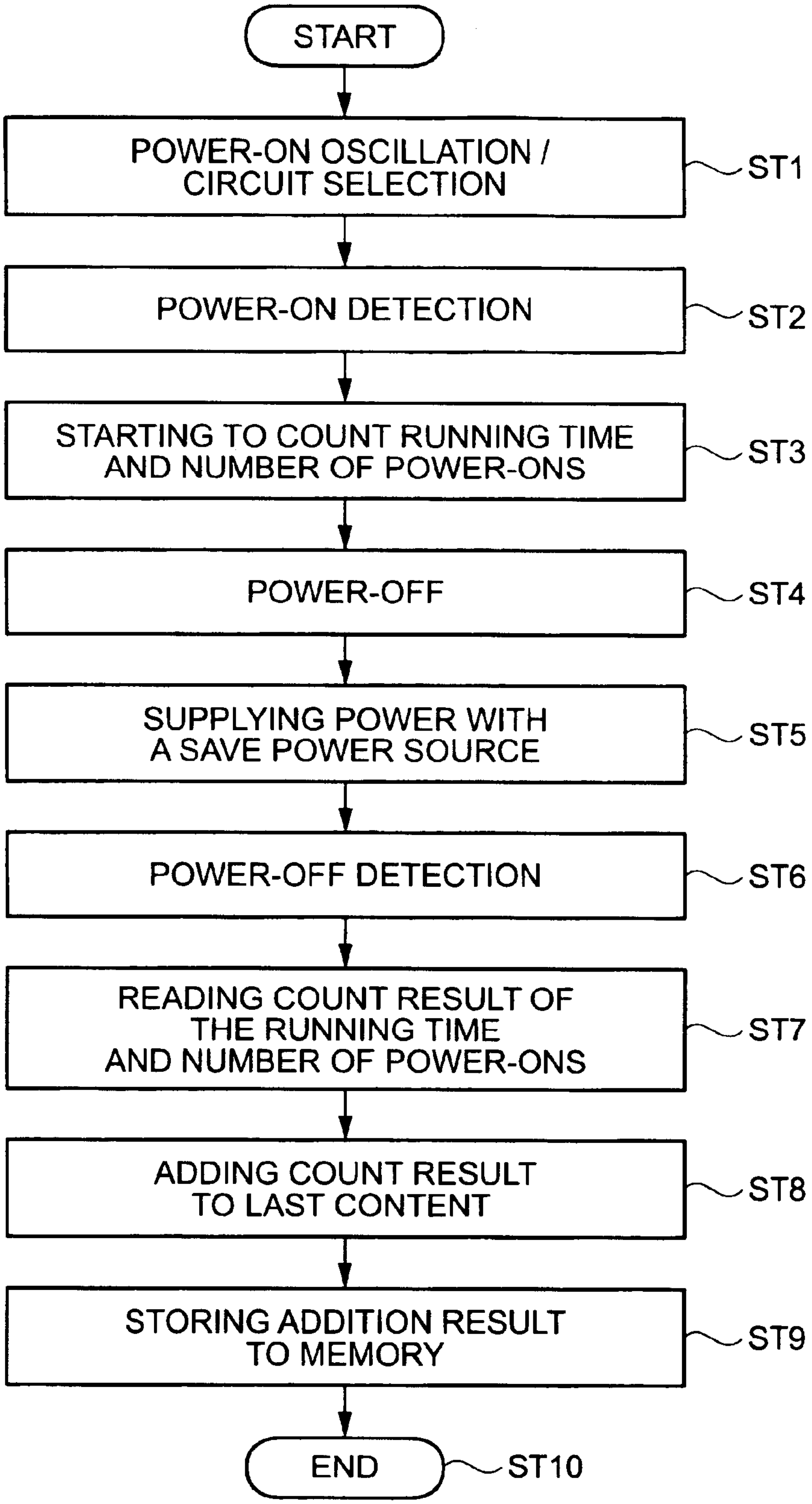
FIG. 6 is a flowchart for explaining operations of an example of the first embodiment.

FIG. 6 is a flowchart for explaining the operation of the Embodiment 1.

In Embodiment 1, the count operation on the running time and the number of power-ons of an electronic apparatus or an electronic part starts from the initial value of 0 at every power-on, and the running time and the number of power-ons at a power-off time are added to the accumulated running time and the accumulated number of power-ons stored in the memory 9, respectively. Next, the addition results are stored as a new accumulated running time and the accumulated number of power-ons in the memory 9.

In addition, Embodiment 1 is described based on an electronic apparatus where the power source is powered-on/off within the working time in one day.

In synchronization with the start of work, the user powers on and drives the electronic apparatus. The first oscillation circuit 21 is selected by the oscillation circuit selection unit 3 in accordance with the external selection signal S2 (Step ST1). At a power-on time, the power-on detection unit 5 detects the power-on and outputs the power-on detection signal S3 to the control unit 8 (Step ST2). The clock signal S1 from the first oscillation circuit 21 is input to the running time count unit 4 through the oscillation circuit selection unit 3, and the power-on detection signal S3 is input to the event number count unit 7. Next, the count operation with respect to the running time and the number of power-ons starts, and the running time and the number of power-ons is counted up to a power-off time (Step ST3).

At a power-off time, a save power source Ves shown in FIG. 4 is supplied through a save power supply port VESD, and the power-off detection unit 6 detects the power-off and outputs the power-off detection signal S4 to the control unit 8 (Step ST4, ST5, ST6). The control unit 8 reads the counted running time count data Dc and the number-of-power-ons count data De from the running time count unit 4 and the event number count unit 7, respectively (Step ST7). Next, when the running time count data Dc and the number-of-power-ons count data De are read, the control unit 8 reads the last accumulated running time count data Dc and the last accumulated number-of-power-ons count data De stored in the memory 9. The currently counted running time count data Dc and the currently counted number-of-power-ons count data De are added to the read results, respectively, the addition results are stored (saved) again in the memory 9, and the process ends (Step ST8, ST9, ST10).

Since the save power source Ves temporarily supplies a power source voltage to the oscillator 1, the count results are not erased but maintained.

In this Embodiment 1, in a case where the time period for counting the running time is within the working time in one day, it is not necessary to perform the count operation up to a day, a month, or a year. Therefore, the divider circuit of the running time count unit 4 can be implemented with a simple construction such that the circuit can be obtained in an advantageous size thereof.

Embodiment 2

Next, operations of another example, Embodiment 2, will be described with reference to FIG. 7.

Figure 7:
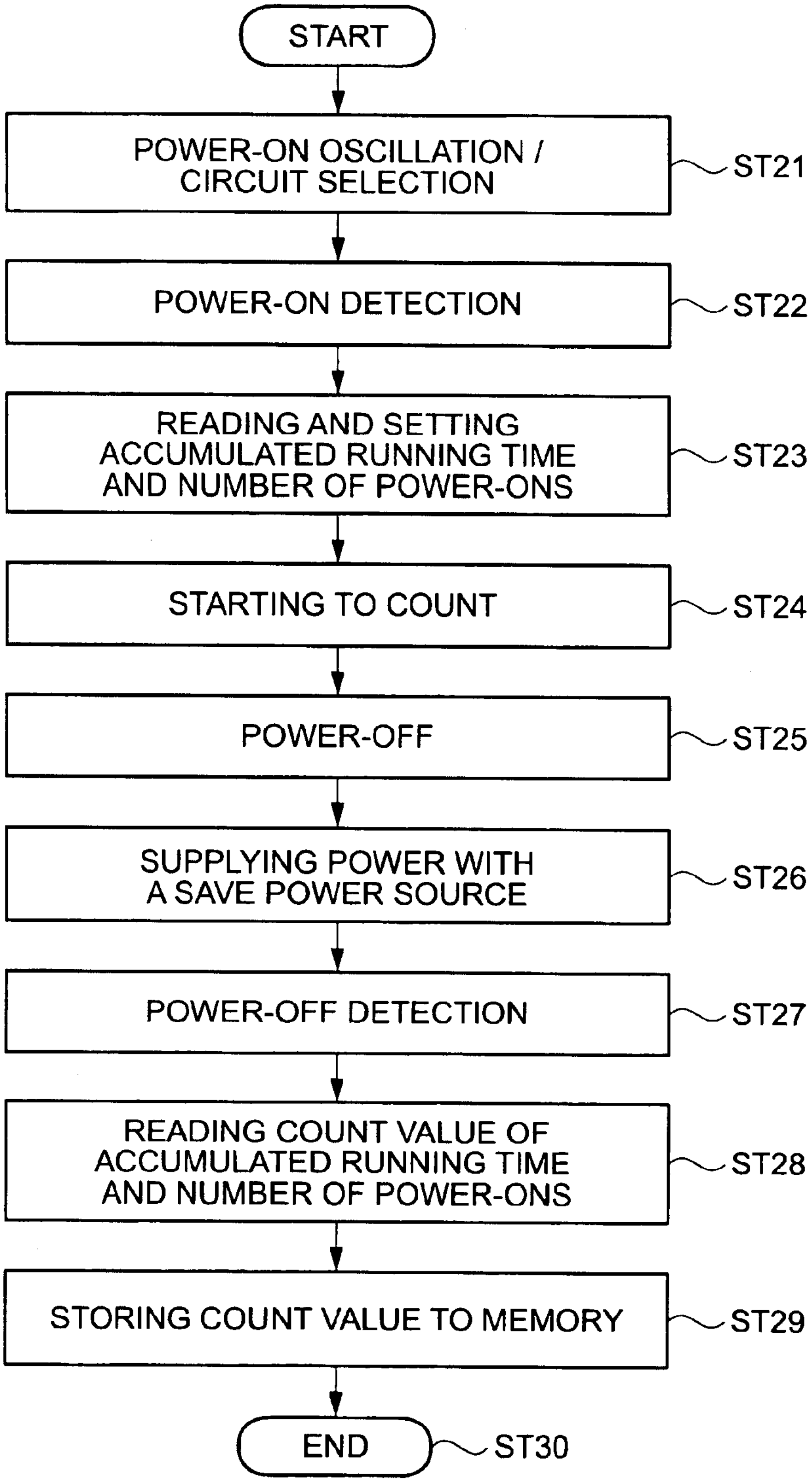
FIG. 7 is a flowchart for explaining operations of another example of the first embodiment.

FIG. 7 is a flowchart for explaining the operation of Embodiment 2.

In Embodiment 2, at a power-on time of the electronic apparatus, the accumulated running time and the accumulated number of power-ons stored in the memory are set to the running time count unit 4 and the event number count unit 7, respectively, and the count operation starts from the respective initial values, and the running time and the number of power-ons accumulated up to a power-off time are stored in the memory.

When the user powers on and drives the electronic apparatus, the first oscillation circuit 21 is selected by the oscillation circuit selection unit 3 in accordance with the external selection signal S2 (Step ST21). Next, the power-on detection unit 5 detects the power-on and outputs the power-on detection signal S3 to the event number count unit 7 and the control unit 8 (Step ST22). The control unit 8 reads the currently accumulated running time count data Dc and the currently accumulated number-of-power-ons count data De from the memory 9, sets them to the divider circuits of the running time count unit 4 and the event number count unit 7, respectively, and the count operation starts (Step ST23, ST24).

At a power-off time, the save power source Ves shown in FIG. 4 is supplied through the save power supply port VESD, and the power-off detection unit 6 detects the power-off and outputs the power-off detection signal S4 to the control unit 8 (Step ST25, ST26, ST27).

At the time of the power-off detection signal S4 being input, the control unit 8 reads the counted running time count data Dc and the number-of-power-ons count data De from the running time count unit 4 and the event number count unit 7, respectively (Step ST28). Next, when the running time count data Dc and the number-of-power-ons count data De are read, the control unit 8 stores (saves) the results in the memory 9, and the process is ended (Step ST29, ST30).

As described above, like Embodiment 1, since the save power source Ves supplies a power source voltage to the oscillator 1, the count results are maintained.

According to this Embodiment, since in the process of reading the counted accumulated running time and storing it in the memory the process can be performed speedily since an addition operation is not required, there is an effect on the saving operation.

(1-3) Effects Obtained with the First Embodiment

As described above, according to the first embodiment of the present invention, the following effects can be obtained.

According to the first embodiment of the present invention, since an oscillator comprises an oscillation circuit for generating a clock signal used to count time, running time count unit for counting the running time, event number count unit for detecting and counting an event such as power-on and power-off, and a memory for storing the results, there is an effect to obtain an oscillator capable of performing an integration operation on the accumulated running time of an electronic apparatus or the number of events such as the power-on and the power-off.

In addition, since operations of the oscillation circuit, the running time count unit or the event number count unit, and the control unit are compensated by an externally supplied save power source at a power-off time of an external power source, there is an effect that the counted running time or the number of power-ons is not erased, but is stored in the memory.

In addition, an oscillation circuit comprising resistors and capacitors built in an IC is employed as a secondary oscillation circuit. If it is used in the same frequency as a first oscillation circuit, there is an effect according to its usage that the oscillation circuit can be used in a case where high accuracy is not required for accumulated running time management.

In addition, since a tuning-fork-type quartz crystal resonator having a frequency of 32.768 kHz is used as a piezoelectric resonator, a compact quartz crystal resonator is obtained. Therefore, there is an effect that an oscillator having a small size can be obtained.

In addition, since a single package module comprising two oscillation circuits, that is, the first and second oscillation circuit, and having an accumulated running time counting function according to its use can be implemented, there is an effect that the oscillator can be implemented in a small size and with low cost.

In addition, since an EEPROM is used as a memory for storing the running time or the number of events such as power-on and power-off, there is an effect that count data such as the accumulated running time and the number of power-ons is not erased even at a power-off time.

(2) Second Embodiment

Next, an oscillator according to a second embodiment of the present invention, having write disabling means for running time count data and/or number-of-power-ons count data stored in a memory 9, will be described with focusing on the difference from the first embodiment.

First, as for a function of the oscillator, writing of running time count data and number-of-power-ons count data will be described. At the time of manufacturing the oscillator, a test of determining whether or not the oscillator normally operates and accurately counts is performed. Just after the test, running time count data or event number count data counted during the test are stored in the memory 9. Since the oscillator according to the embodiment counts the running time or the event number of an electronic apparatus, it is necessary to set an accumulated running time or a number of power-ons as a value of 0 at the time that the oscillator is built in the electronic apparatus. For this reason, at the time that it is shipped, a write command is input as a write signal from a CNT port, the running time count data and number-of-power-ons count data stored in a memory 9 is reset and set as a value of 0.

However, in a case where a write operation can be performed after the oscillator is built in the electronic apparatus, if an accumulated running time counted by the oscillator of the electronic apparatus used for a long time is reset, in the determination whether the electronic apparatus is suitable for recycling or the price determination as a used product for sale, there is a problem in that it may be treated as a short-term used product, and thus reliability of the accumulated running time is lowered. Therefore, it is preferable that the write function is invalidated after the oscillator is built in the electronic apparatus.

The oscillator according to the embodiment comprises means for invalidating the writing signal for the accumulated running time count data and/or the accumulated number-of-power-ons count data to increase reliability on such data.

Figure 8:
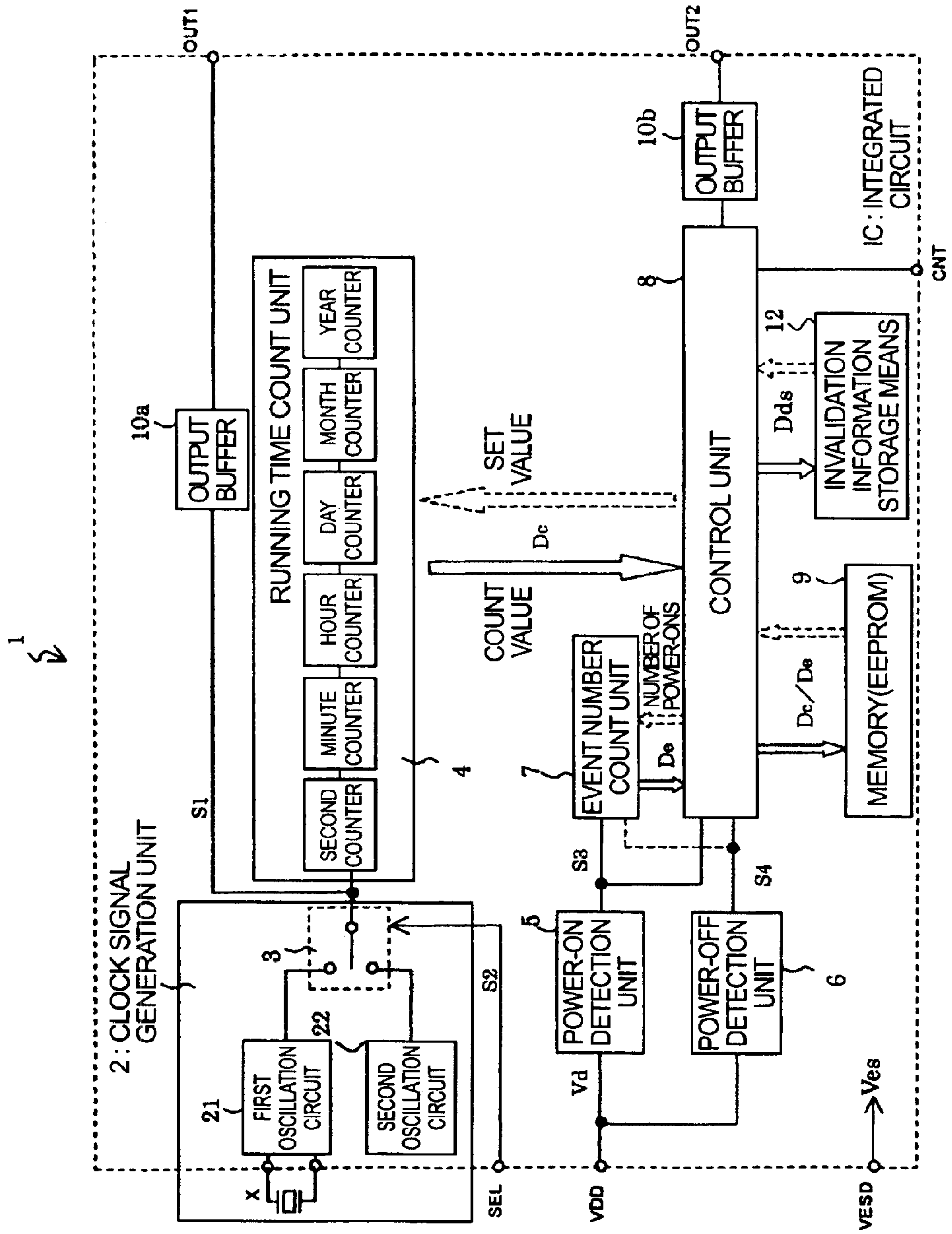
FIG. 8 is a block diagram illustrating a construction of an oscillator according to a second embodiment.

FIG. 8 is a block diagram illustrating a construction of the oscillator according to the second embodiment of the present invention. The oscillator shown in FIG. 8, a disable data storage means 12 is different from the first embodiment, and the other construction is the same as the first embodiment. First, operations of the disable data storage means 12 will be described. A test of determining whether or not the oscillator 1 of the embodiment counts the running time and number-of-power-ons accurately is performed. After the test, an external reset signal is input to the CNT port in order to reset the running time count data and the number-of-power-ons count data as a value of 0. An external write invalidation signal is input to the CNT port. A control unit 8 outputs disable data Dds to the disable data storage means 12. Next, the disable data Dds transmitted from the control unit 8 is stored in the disable data storage means 12.

The disable data storage means 12 according to the embodiment is constructed with a memory where data once written cannot be changed. In the embodiment, OTPROM (One Time Programmable Read Only Memory) is used. The disable data stored in the disable data storage means 12 is 2-bit data of which a 1-bit is allocated to write invalidation of the accumulated running time count data and the other 1-bit is allocated to write signal invalidation of the number-of-power-offs count data. When the external write signal is input, the control unit 8 reads the write disable data, and performs a write operation if a content of the information is a value of 1 (High) and no write operation if the content of the information is a value of 0 (Low).

Obtained Effect

As described above, according to the second embodiment of the present invention, it is possible to increase reliability of data of the running time or the number of power-ons used for determining whether or not an electronic apparatus is recycled.

(3) Third Embodiment

Next, a third embodiment of applying an oscillator of the present invention to a personal computer, as an electronic apparatus will be described.

Example of Electronic Apparatus

Figure 9:
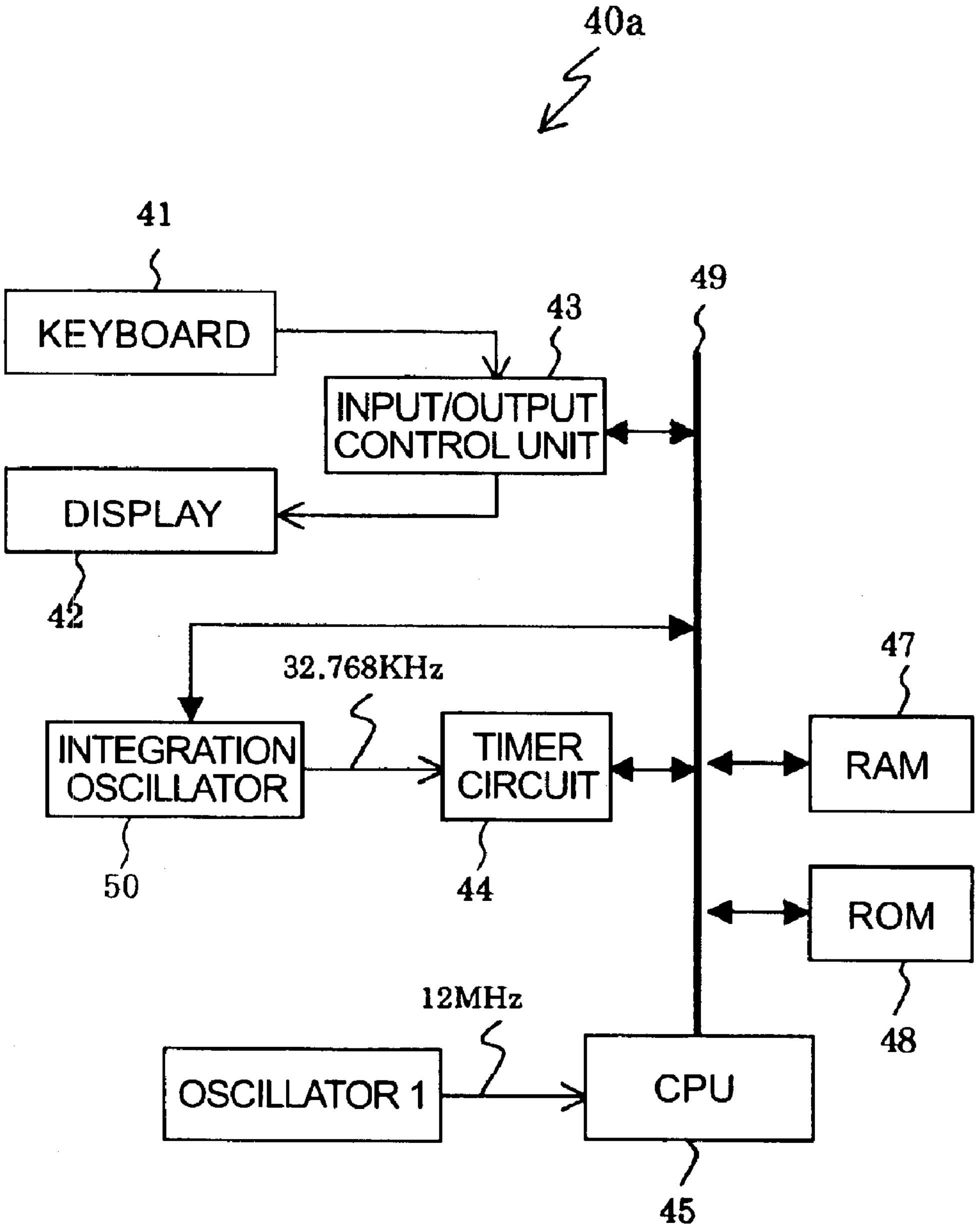
FIG. 9 is a block diagram illustrating a construction of a personal computer using an oscillator according to the first embodiment in a third embodiment.
Figure 10:
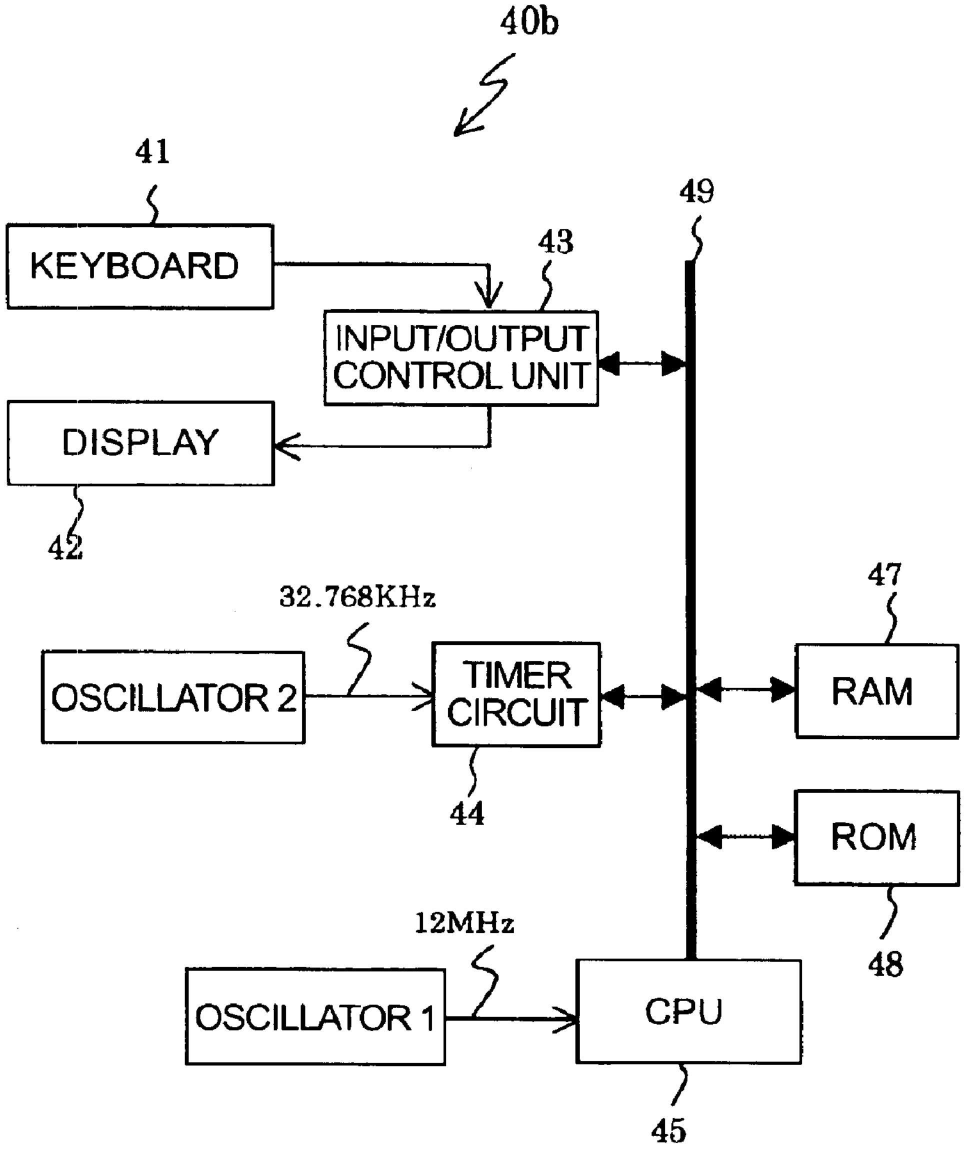
FIG. 10 is a block diagram illustrating the construction of a personal computer.

FIG. 9 is a diagram illustrating a schematic construction of a personal computer as an example of electronic apparatus using an oscillator according to the first embodiment of the present invention.

In the third embodiment, a case where running time of a main body of the personal computer, that is, running time for an employee within the working time in one day is accurately recorded is described as an embodiment. In addition, a packaged quartz crystal oscillator (SPXO: Simple Packaged X'stal Oscillator), which is not subjected to temperature control or temperature compensation, is described as an oscillator employed to the third embodiment.

In FIG. 9, one of the output ports of the oscillator according to the present invention supplies a clock signal having a frequency of 32.768 kHz to a timer circuit 44 like the conventional art, and the other input/output port is connected to a CPU bus 49 of a CPU 45, whereby communication of needed data such a control command, running time, etc., is performed.

When the personal computer is powered-on by an employee going to work in the morning, yesterday-accumulated (or last-day accumulated) running time and number of power-ons are set to an integration oscillator 50, and then, a count operation starts. In a case where the employee leaves his/her station for a long time in order to take break or attend a meeting, the personal computer is powered-off, and the currently accumulated running time or number of power-ons is stored in a memory. After that, when the employee takes a seat and the power is turned on, the running time and the number of power-ons is set like the aforementioned and the count operation starts again. These operations are repeated during the working time of the employee. For example, if a function of reading and displaying the accumulated running time is provided to the application program, it is possible for the CPU 45 to read the result in the memory of the integration oscillator 50 and display the accumulated running time on the display 42.

Behavior of an employee in the working time in one day is different day by day. In addition, since behaviors of other employees are naturally different in one day, all the personal computers have different running time.

Obtained Effect

As described above, in an electronic apparatus using an oscillator according to the present invention, accumulated running time for each apparatus is semi-permanently stored in the oscillator even though users or methods used in accordance with a schedule of a user in one day are different for the same type electronic apparatuses. As a result, in a case where an expiration date of a personal computer is expired, there is an effect that it is possible to easily determine whether or not it is to be recycled based on the read accumulated running time as a criterion for determination.

In addition, a dedicated circuit for counting the running time or the number of power-ons is used, and an oscillator with a function of a memory for storing the count data being integrated is used. Accordingly, since additional dedicated circuits for implementing such functions or new external storage devices for preventing the count data from being erased need not be installed, there is an effect that a compact low cost electronic apparatus can be obtained.

In addition, in an electronic apparatus having an operational mode such as a power down mode, an oscillator capable of retaining the currently accumulated running time by means of a temporary save power source is used at a power-off time of a main power source. As a result, since a backup power source for saving the counted accumulated running time is not needed, there is an effect that a low power consumption electronic apparatus can be obtained.

(4) MODIFIED EXAMPLES

The present invention is not limited to the aforementioned embodiments and can be implemented in various embodiments. For example, the following modified embodiments are available.

First Modified Example

Although a flexural quartz crystal resonator is described as an oscillation source in the first oscillation circuit of the first embodiment of the present invention, the present invention is not limited to this. For example, an AT-cut-type quartz crystal resonator, a SAW resonator, or a resonator constructed with Piezoelectric Ceramics, Lithium Tantalate, or Lithium Niobate may be used as a quartz crystal resonator.

Second Modified Example

Although an inverter-type oscillation circuit using a MOS transistor is described as a first oscillation circuit of the aforementioned first embodiment of the present invention, a Korpits type oscillation circuit using a bipolar transistor may be used.

Third Modified Example

Although an RC oscillation circuit using a resistor and a capacitor is described as an oscillation source in the second oscillation circuit of the first embodiment of the present invention, the present invention is not limited to this. In other words, although, the quartz crystal resonator or a coil cannot be integrated with an IC, the oscillation source can be constructed with an oscillation circuit using a quartz crystal resonator or an LC oscillation circuit using a coil L and a capacitor C.

Fourth Modified Example

Although a packaged quartz crystal resonator (SPXO), as an oscillator of the third embodiment, is adapted to the present invention, the present invention is not limited to this. For example, a temperature compensated quartz crystal oscillator (TCXO) or a voltage controlled quartz crystal oscillator (VCXO) may be used as an oscillator. Running time of an electronic apparatus or an electronic part used for the electronic apparatus can be counted based on output signals of these oscillators. In addition, the present invention can be adapted to an electronic apparatus (such as a cellular phone) having an intermittent receiving mode for intermittently performing a receiving operation or another electronic apparatus (such as an LCD panel in a personal computer) having a low power consumption mode (power down mode) for temporarily stopping some functions, which can reduce power consumption. In other words, it can be adapted to count the running time of an electronic part or an electronic apparatus in an operational mode for driving or temporarily stopping the apparatus in accordance with a predetermined condition such as the intermittent receiving mode or the low power consumption mode.

What is claimed is:

1. An oscillator operated with an external power source or an external save power source used at a power-off time of the external power source, comprising:

a clock signal generation unit generating and outputting clock signals having predetermined frequencies;

a power-on detection unit detecting a power-on event of the external power source and outputting power-on detection signals;

a power-off detection unit detecting a power-off event of the external power source and outputting power-off detection signals;

storage storing accumulated running time up to a power-on time of the external power source;

a running time count unit inputting the clock signals from the clock signal generation unit and counting running time from a time of the power-on detection signals being input to a time of the power-off detection signals being input; and a control unit reading the running time at the time of the power-off detection signals being input, reading the accumulated running time from the storage, adding the running time to the accumulated running time to yield an addition result, and storing the addition result as a new accumulated running time in the storage.

2. The oscillator according to claim 1, wherein the oscillator further comprises:

disable data storage storing disable data used to invalidate an operation by which the accumulated running time stored in the storage is written and changed in accordance with externally input write signals, and wherein the control unit performs a write operation based on the disable data.

3. The oscillator according to claim 1, wherein the clock signal generation unit comprises at least one of:

a first oscillation circuit having a piezoelectric resonator, oscillating at a predetermined frequency to generate clock signals; and a second oscillation circuit having a resistor and a capacitor, oscillating at a predetermined frequency to generate clock signals.

4. The oscillator according to claim 3, wherein the clock signal generation unit further comprises:

an oscillation circuit selection unit inputting the clock signals from the first and second oscillation circuits, selecting one of the clock signals based on external selection signals, and outputting the selected clock signal.

5. The oscillator according to claim 1, wherein the oscillator comprises:

an event number count unit to which at least one of the power-on detection signals and the power-off detection signals are input and which counts the number of power-ons or the number of power-offs, and wherein the control unit stores the accumulated number of power-ons or the accumulated number of power-offs in the storage.

6. The oscillator according to claim 5, wherein the oscillator further comprises:

disable data storage storing disable data used to invalidate an operation by which at least one of the accumulated running time and the accumulated event number stored in the storage is written and changed in accordance with externally input write signals, and wherein the control unit performs a write operation based on the disable data.

7. An electronic apparatus comprising the oscillator according to claim 1, wherein the electronic apparatus operates based on output signals of the oscillator.

8. The electronic apparatus according to claim 7, wherein the electronic apparatus has at least an operational mode temporarily stopping and driving the oscillator in accordance with a predetermined condition.

9. An oscillator operated with an external power source or an external save power source used at a power-off time of the external power source, comprising:

a clock signal generation unit generating and outputting clock signals having predetermined frequencies;

a power-on detection unit detecting a power-on event of the external power source and outputting power-on detection signals;

a power-off detection unit detecting a power-off event of the external power source and outputting power-off detection signals;

storage storing accumulated running time up to a power-on time of the external power source;

a running time count unit setting the accumulated running time, inputting the clock signals from the clock signal generation unit, and further accumulating the running time from a time of the power-on detection signals being input to a time of the power-off detection signals being input; and a control unit reading the accumulated running time from the storage at the time of the power-on detection signals being input to set the running time count unit with the read accumulated running time, reading a new accumulated running time counted by the running time count unit at the time of the power-off detection signals being input, and storing the new accumulated running time in the storage.

10. The oscillator according to claim 9, wherein the piezoelectric resonator comprises a tuning-fork-type quartz crystal resonator.

11. The oscillator according to claim 9, wherein the clock signal generation unit comprises at least one of:

a first oscillation circuit having a piezoelectric resonator, oscillating at a predetermined frequency to generate clock signals; and a second oscillation circuit having a resistor and a capacitor, oscillating at a predetermined frequency to generate clock signals.

12. The oscillator according to claim 11, wherein the clock signal generation unit further comprises:

an oscillation circuit selection unit inputting the clock signals from the first and second oscillation circuits, selecting one of the clock signals based on external selection signals, and outputting the selected clock signal.

13. The oscillator according to claim 9, wherein the oscillator further comprises:

disable data storage storing disable data used to invalidate an operation by which the accumulated running time stored in the storage is written and changed in accordance with externally input write signals, and wherein the control unit performs a write operation based on the disable data.

14. The oscillator according to claim 9, wherein the oscillator comprises:

an event number count unit to which at least one of the power-on detection signals and the power-off detection signals are input and which counts the number of power-ons or the number of power-offs, and wherein the control unit stores the accumulated number of power-ons or the accumulated number of power-offs in the storage.

15. The oscillator according to claim 14, wherein the oscillator further comprises:

disable data storage storing disable data used to invalidate an operation by which at least one of the accumulated running time and the accumulated event number stored in the storage is written and changed in accordance with externally input write signals, and wherein the control unit performs a write operation based on the disable data.

16. An electronic apparatus comprising the oscillator according to claim 9, wherein the electronic apparatus operates based on output signals of the oscillator.

17. The electronic apparatus according to claim 16, wherein the electronic apparatus has at least an operational mode temporarily stopping and driving the oscillator in accordance with a predetermined condition.

* * * * *